US008652968B2

United States Patent
Yu et al.

(10) Patent No.: US 8,652,968 B2
(45) Date of Patent: Feb. 18, 2014

(54) METHOD OF MANUFACTURING A SEMICONDUCTOR DEVICE

(71) Applicant: Samsung Electronics Co., Ltd., Suwon-si (KR)

(72) Inventors: Han Geun Yu, Seoul (KR); Eunsung Kim, Seoul (KR); Chulho Shin, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/719,235

(22) Filed: Dec. 19, 2012

(65) Prior Publication Data

US 2013/0178067 A1 Jul. 11, 2013

(30) Foreign Application Priority Data

Jan. 11, 2012 (KR) .................. 10-2012-0003496

(51) Int. Cl.
*H01L 21/311* (2006.01)
(52) U.S. Cl.
USPC ..................... 438/699; 438/700; 438/717
(58) Field of Classification Search
USPC .......... 438/694, 695, 696, 697, 699, 700, 717
See application file for complete search history.

(56) References Cited

U.S. PATENT DOCUMENTS

| 6,204,187 | B1* | 3/2001 | Rupp et al. ..................... 438/702 |
| 7,429,536 | B2* | 9/2008 | Abatchev et al. ............ 438/725 |
| 7,749,902 | B2 | 7/2010 | Kim |
| 7,759,197 | B2 | 7/2010 | Tran |
| 7,759,242 | B2 | 7/2010 | Meyer |
| 2007/0037410 | A1* | 2/2007 | Chang et al. .................. 438/780 |
| 2008/0124931 | A1* | 5/2008 | Lee et al. ...................... 438/692 |
| 2010/0035192 | A1 | 2/2010 | Ando |
| 2010/0248491 | A1 | 9/2010 | Sun |
| 2011/0076846 | A1 | 3/2011 | Lee |
| 2011/0081778 | A1 | 4/2011 | Lee |
| 2011/0159686 | A1 | 6/2011 | Jung |

FOREIGN PATENT DOCUMENTS

| JP | 2006-294771 A | 10/2006 |
| KR | 10-2010-0134418 A | 12/2010 |
| KR | 10-2011-0001693 A | 1/2011 |

* cited by examiner

*Primary Examiner* — Kevin M Picardat
(74) *Attorney, Agent, or Firm* — Muir Patent Consulting, PLLC

(57) ABSTRACT

A method of fabricating a semiconductor device may include forming spacer line patterns on sidewalls of photoresist. A planarization etching process may be performed on a subsequently added planarization layer, after forming a mesh-shaped mask pattern from the spacer line patterns.

20 Claims, 12 Drawing Sheets

METHOD OF MANUFACTURING A
SEMICONDUCTOR DEVICE

CROSS-REFERENCE TO RELATED
APPLICATIONS

This U.S. non-provisional patent application claims priority under 35 U.S.C. §119 to Korean Patent Application No. 10-2012-0003496, filed on Jan. 11, 2012, in the Korean Intellectual Property Office, the entire contents of which are hereby incorporated by reference.

BACKGROUND OF THE INVENTION

Embodiments of the inventive concepts relate to a method of fabricating a semiconductor device.

To meet a growing demand for high density semiconductor devices, there is a need to find a method of forming small-sized patterns. However, there is significant difficulty in forming small holes, such as holes of 50nm or less in diameter or width, due to limitations of resolution of an exposing apparatus (e.g., photolithographic exposing apparatus). Although research has been conducted to address this difficulty, solutions suffer from various difficulties, such as complexity in fabrication process, high production costs, and low production yield.

SUMMARY

Embodiments of the inventive concepts provide a simplified method of fabricating a high density semiconductor device with a high yield.

According to example embodiments, a method of fabricating a semiconductor device may include sequentially forming a first mask layer and a second mask layer on a target layer, forming first lines on the second mask layer, forming a first planarization layer on the second mask layer to cover a structure provided with the first lines and have a flat top surface, forming a third mask layer on the first planarization layer, forming second lines on the third mask layer to cross the first lines, etching the third mask layer and the first planarization layer, using the second lines as an etch mask, to form third mask line patterns and first planarization lines partially exposing the first lines and the second mask layer, etching the second mask layer using the first and second lines as an etch mask to form a second mask pattern shaped like a mesh, forming a second planarization layer to cover a structure provided with the second mask pattern and have a flat top surface, performing a planarization etching process on the third mask line patterns and the second planarization layer to expose the first planarization lines and remain second planarization lines between the first planarization lines, removing the first and second planarization lines to expose sidewalls of the first line and the second mask pattern, etching the first mask layer using the second mask pattern as an etch mask to form a first mask pattern shaped like a mesh, and etching the target layer using the first mask pattern as an etch mask to form contact holes.

In example embodiments, the first mask layer may be formed of an amorphous carbon layer, the first and second planarization layers may be formed of a spin-on-carbon (SOC) layer, and the second and third mask layers may be formed of a silicon oxynitride layer.

In example embodiments, the forming of the first lines may include forming a plurality of first photoresist patterns on the second mask layer to be parallel to the first lines, forming the first lines on sidewalls of the first photoresist patterns, and removing the first photoresist patterns.

In example embodiments, the first photoresist pattern has the same width as that of the first line.

In example embodiments, a space between the first photoresist patterns may be equivalent to three times a width of the first photoresist pattern.

In example embodiments, the forming of the second line may include forming a plurality of second photoresist patterns on the third mask layer to cross the first lines, forming the second lines on sidewalls of the second photoresist patterns, and removing the second photoresist patterns.

In example embodiments, the second photoresist pattern has the same width as that of the second line.

In example embodiments, a space between the second photoresist patterns may be equivalent to three times a width of the second photoresist pattern.

In example embodiments, the first and second lines may be formed of a silicon oxide layer. The target layer may be formed of a silicon oxide layer, and the etching of the target layer may be performed to remove both of the first lines and the second mask layer and expose the first mask pattern.

According to example embodiments, a method of fabricating a semiconductor device may include forming a mask layer on a target layer, forming a plurality of first line patterns on the mask layer, forming a first planarization layer on the first line patterns, forming a plurality of second line patterns on the first planarization layer to cross the first line patterns, etching the first planarization layer using the second line patterns as an etch mask to expose the first line patterns, etching the mask layer using the second and first line patterns to form a mask pattern shaped like a mesh, forming a second planarization layer on the mask pattern, removing a portion of the second planarization layer and the second line patterns by a planarization etching process, and etching the target layer using the mask pattern to form contact holes.

In example embodiments, the mask layer may include a first mask layer and a second mask layer, the first mask layer may be formed of an amorphous carbon layer, the first and second planarization layers may be formed of a spin-on-carbon layer, and the second mask layer may be formed of a silicon oxynitride layer.

In example embodiments, the mask pattern may include a second mask pattern and a first mask pattern, the second mask pattern may be formed before the forming of the second planarization layer, and the first mask pattern may be formed after the forming of the second line pattern.

In example embodiments, the method may further include forming a third mask layer on the first planarization layer, before the forming of the second line patterns. The third mask layer may be removed by the planarization etching process.

According to some embodiments, a method of forming a plurality of holes in a target layer may comprise forming a first mask layer on the target layer; forming a second mask layer on the first mask layer, the second mask layer having an etch selectivity with respect to the first mask layer; forming a first set of line patterns extending in a first direction over the second mask layer; forming a second set of line patterns extending in a second direction, different from the first direction, over the second mask layer; using the first set of line patterns and second set of line patterns as a mask, forming a first resultant structure including at least etching the second mask layer to form a second mask layer pattern having a plurality of holes; forming a planarization layer over the first resultant structure after etching the second mask layer; forming a second resultant structure including at least performing a planarization etch of the planarization layer and portions of the first resultant structure, the second resultant structure having a flat top surface; etching the second resultant structure including etching the first mask layer to form a first mask layer pattern having a plurality of holes corresponding to the holes of the second mask layer pattern; etching the plurality of holes in the target layer using the first mask layer pattern as a mask.

The second set of line patterns may each comprise a stack of first, second and third materials, and the step of performing a planarization etch of the planarization layer and portions of the first resultant structure may comprise removing the first and second materials of each of the second set of line patterns to expose the third material of the second set of line patterns.

The etching of the second resultant structure may be a single etch step and comprise etching the third material of the second set of line patterns.

The first material may be silicon oxide, the second material may be silicon oxynitride and the third material may be spin on carbon.

The method may further comprise ashing to remove the first mask layer pattern.

Each of the first set of line patterns and second set of line patterns may comprise respective spacer line patterns each formed by forming the respective spacer line pattern on a sidewall of a respective photoresist pattern and removing the respective photoresist pattern.

The step of forming the planarization layer over the first resultant structure after etching the second mask layer may include filling the holes of the second mask layer pattern with material of the planarization layer.

BRIEF DESCRIPTION OF THE DRAWINGS

Example embodiments will be more clearly understood from the following brief description taken in conjunction with the accompanying drawings.

FIGS. 1 through 12 are perspective views illustrating a method of fabricating a semiconductor device according to example embodiments of the inventive concepts.

Figure 1:
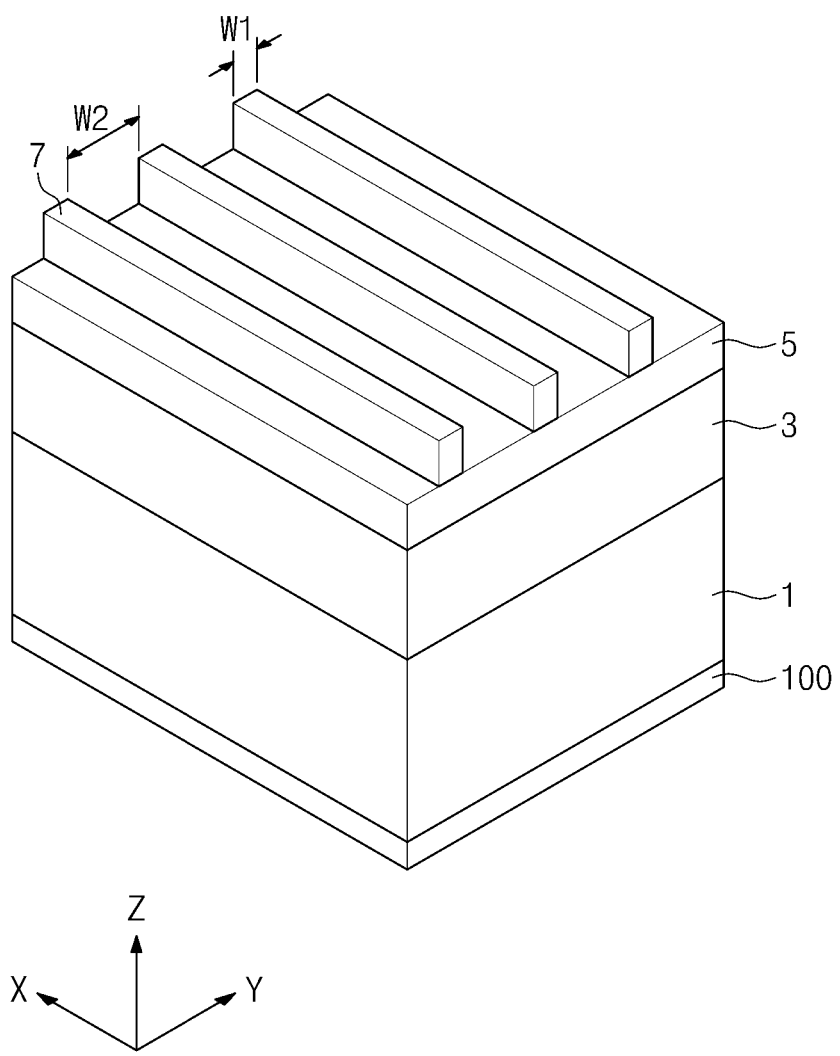
FIGS. 1 through 12 represent non-limiting, example embodiments as described herein.

It should be noted that these figures are intended to illustrate the general characteristics of methods, structure and/or materials utilized in certain example embodiments and to supplement the written description provided below. These drawings may not be to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 12 are perspective views illustrating a method of fabricating a semiconductor device according to example embodiments.

Referring to FIG. 1, a target layer 1 may be formed on a semiconductor substrate 100. The semiconductor substrate 100 may be and/or comprise a single-crystalline silicon wafer, a silicon-on-insulator (SOI) wafer, or a structure with a silicon epitaxial layer. Transistors and/or interconnection wires may be provided on the semiconductor substrate 100. Before the formation of the target layer 1, an etch-stop layer may be formed on the semiconductor substrate 100. The target layer 1 may be an insulator, and may be, for example, a silicon oxide layer. A first mask layer 3 may be formed on the target layer 1. In example embodiments, the first mask layer 3 may be an amorphous carbon layer. The first mask layer 3 may be formed using a chemical vapor deposition. A second mask layer 5 may be formed on the first mask layer 3. In example embodiments, the second mask layer 5 may be formed of a silicon oxynitride layer. The second mask layer 5 may serve as a layer protecting the first mask layer 3. The second mask layer 5 may have an etch selectivity with respect to the first mask layer 3 such that certain etchants will etch the first mask layer 3 but leave second mask layer 5 substantially unaffected. The second mask layer 5 may also have an etch selectivity with respect to the first mask layer 3 such that certain etchants will etch the second mask layer 5 while leaving first mask layer 3. First photoresist patterns 7 may be formed on the second mask layer 5 to be parallel to each other. For example, the first photoresist patterns 7 may be a plurality of line patterns extending along a first direction (e.g., the X direction in FIG. 1). The first photoresist patterns 7 may be formed using a photolithography process, and the second mask layer 5 may serve as an anti-reflecting layer in the photolithography process for forming the first photoresist patterns 7. The first photoresist patterns 7 may be formed to have a line width corresponding to the minimum dimension that can be realized by photolithography processes. In addition, a shrink process may be performed to reduce further the widths of the first photoresist patterns 7. In example embodiments, the first photoresist patterns 7 may have a width W1 equivalent to about one-third of a space W2 between the first photoresist patterns 7.

Figure 2:
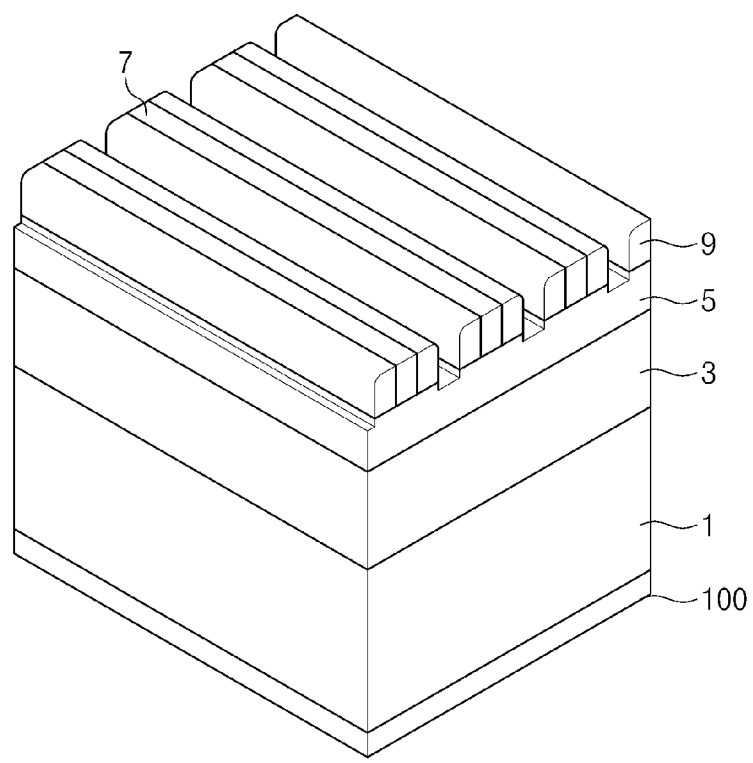

Referring to FIG. 2, first spacer line patterns 9 may be formed on sidewalls of each first photoresist pattern 7. The first spacer line patterns 9 may be formed by, for example, conformally forming a silicon oxide layer using an atomic layer deposition process and performing an etch-back process thereon. In example embodiments, the silicon oxide layer may be formed to have a thickness equivalent to the width of the first photoresist pattern 7. As the result of the etch-back process, a top surface of the second mask layer 5 may be partially recessed between the first spacer line patterns 9.

Figure 3:
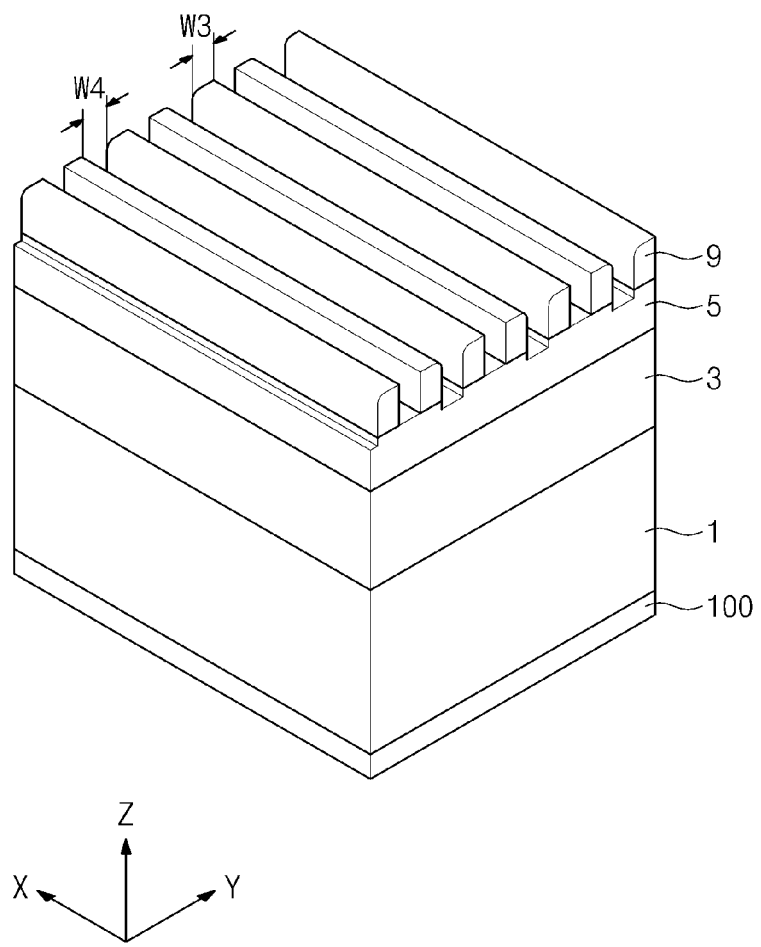

Referring to FIG. 3, the first photoresist patterns 7 may be removed by an ashing process. The ashing process may be performed using an oxygen-containing gas. During the ashing process, the first mask layer 3 may be protected by the second mask layer 5 provided thereon. For example, the second mask layer 5 may prevent undesired removal of the first mask layer 3 made of amorphous carbon, which otherwise may be removed by the ashing process in the absence of the second mask layer 5. The sidewalls of the first spacer line pattern 9 contacting the first photoresist pattern 7 may be exposed by the removal of the first photoresist patterns 7. In example embodiments, a width W3 of each of the first spacer line patterns 9 may be substantially equivalent to a space W4 between the first spacer line patterns 9. Furthermore, the width W3 of each first spacer line pattern 9 may be substantially equivalent to the width W1 of the first photoresist pattern 7.

Figure 4:
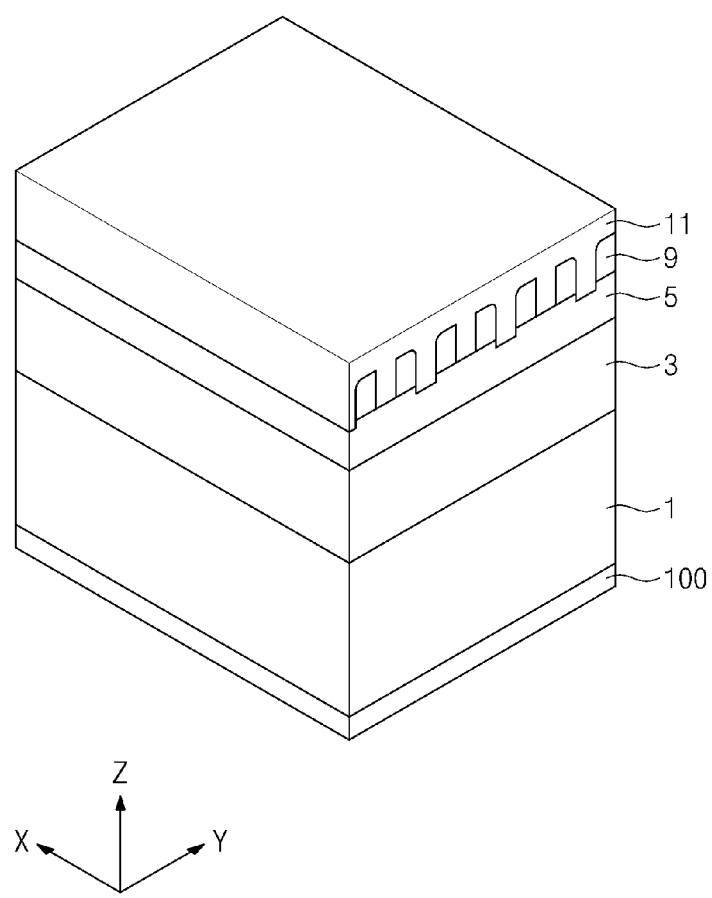

Referring to FIG. 4, a first planarization layer 11 may be formed on first line patterns 9 over the semiconductor substrate 100, from which the first photoresist patterns 7 are removed. The first planarization layer 11 may be formed of a spin-on-carbon (SOC) layer. The first planarization layer 11 may be supplied in the form of liquid and be formed using a spin-coating process. Accordingly, the first planarization layer 11 may have a good gap-fill property. In example embodiments, the first planarization layer 11 may be formed to fill a space between the first spacer line patterns 9 and have a smooth or substantially a flat top surface. The planarization layer 11 may be formed with or without a polishing step (e.g., such as a CMP step) after deposition of the planarization layer 11 material. A dry process may be performed on the first planarization layer 11.

Figure 5:
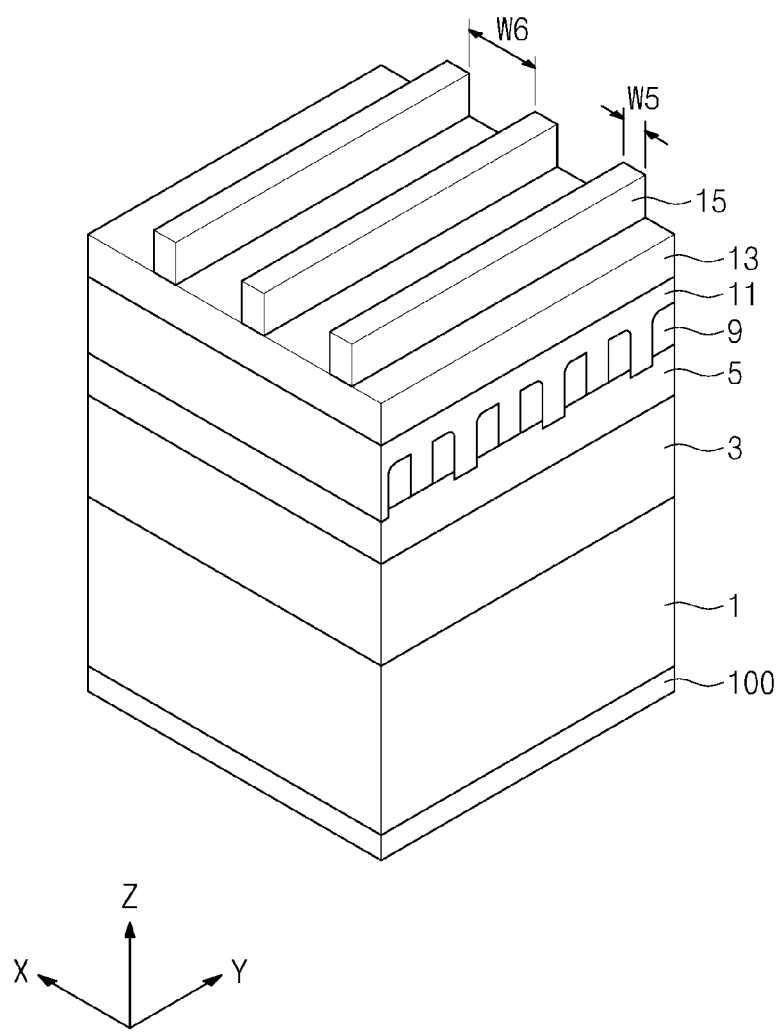

Referring to FIG. 5, a third mask layer 13 may be formed on the first planarization layer 11. The third mask layer 13 may be formed of, for example, a silicon oxynitride layer. Second photoresist patterns 15 may be formed on the third mask layer 13 to be parallel to each other. For example, the second photoresist patterns 15 may be a plurality of line patterns extending along a second direction crossing the first direction (e.g., the Y direction in FIG. 5, crossing the first direction X, which may be perpendicular to each other). The second photoresist patterns 15 may be formed using the same or similar process as that for the first photoresist patterns 7. A width W5 of the second photoresist pattern 15 may be substantially equivalent to about one-third of a space W6 between the second photoresist patterns 15.

Figure 6:
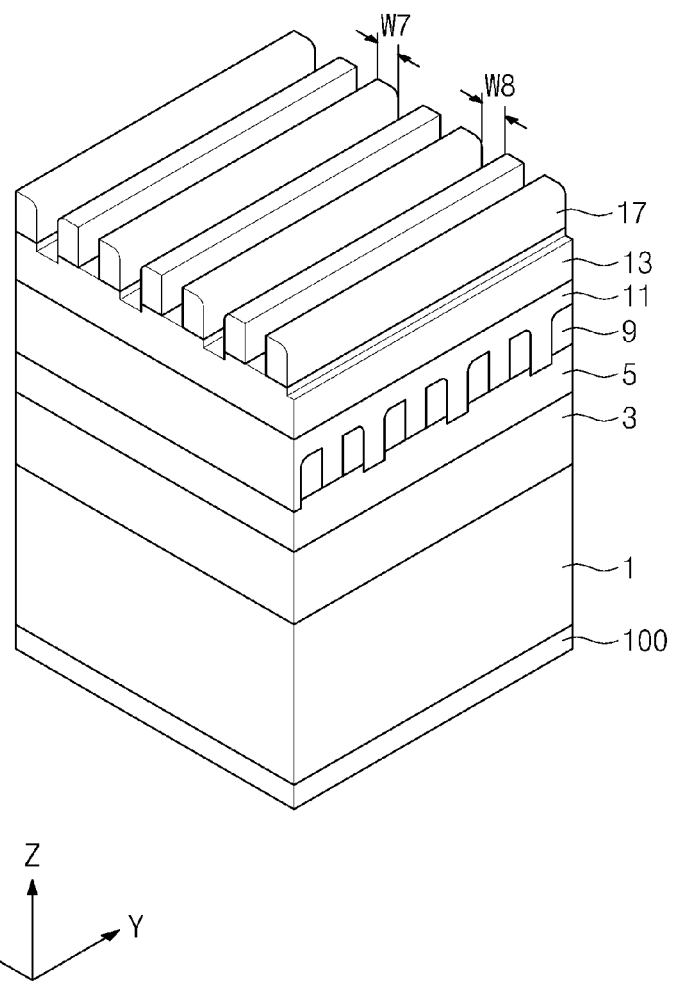

Referring to FIG. 6, second spacer line patterns 17 may be formed to cover sidewalls of the second photoresist pattern 15. The second spacer line patterns 17 may be formed using the same or similar process as that for the first spacer line patterns 9. After the formation of the second spacer line patterns 17, the second photoresist patterns 15 may be removed by an ashing process. A width W7 of the second spacer line patter 17 may be substantially equivalent to about a space W8 between the second spacer line patterns 17. The width W7 of the second spacer line patterns 17 may be substantially equivalent to the width W5 of the second photoresist pattern 15. A top surface of the third mask layer 13 may be partially recessed by an etching process that may be performed to form the second spacer line patterns 17 (e.g., after forming an insulating layer over second photoresist pattern 15 and exposed portions of the top surface of the third mask layer 13, etching this insulating layer to re-expose and etch those portions of the tope surface of the third mask layer 13 to form the second spacer line patterns 17).

Figure 7:
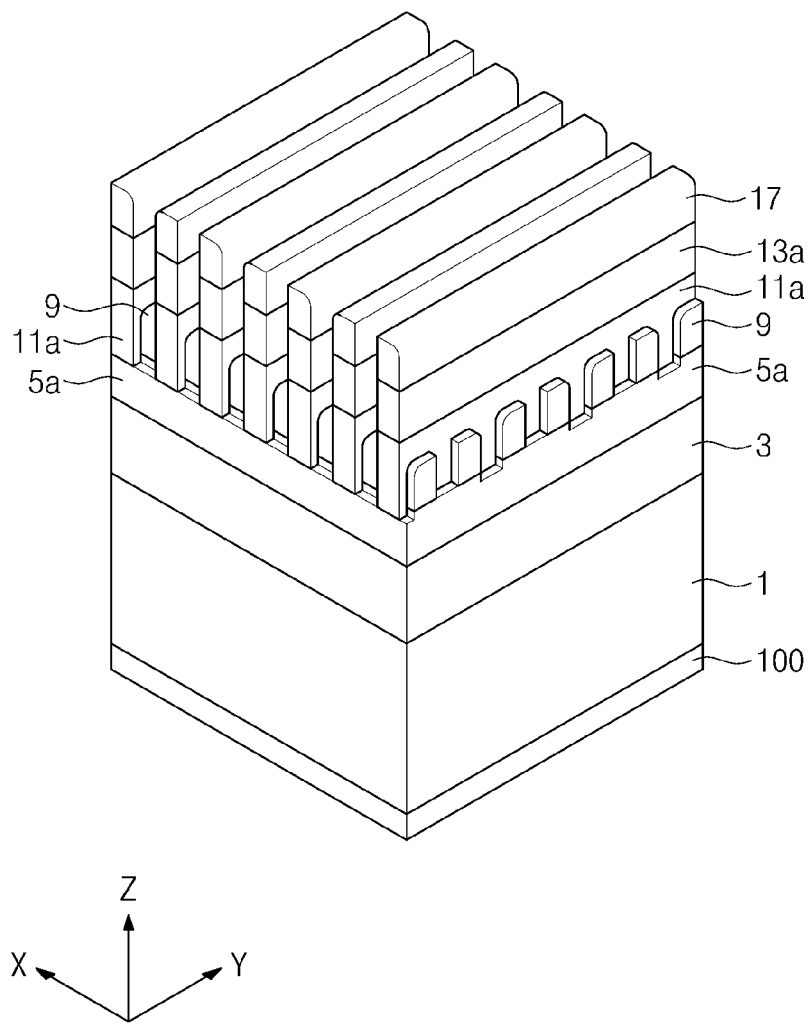

Referring to FIG. 7, the third mask layer 13 and the first planarization layer 11 may be successively etched to form third mask line patterns 13a and first planarization line patterns 11a and expose partially the first spacer line patterns 9 between the first planarization line patterns 11a. The second spacer line patterns 17 may be used as an etch mask, in the etching process. The etching process may be an anisotropic etching process and expose second mask 5a at locations between first spacer line patterns 9 that are not under the second spacer line patterns 17. The etching process may result in a grid of exposed portions of second mask 5a (not shown by the perspective view of FIG. 7), each portion being isolated from each other.

Figure 8:
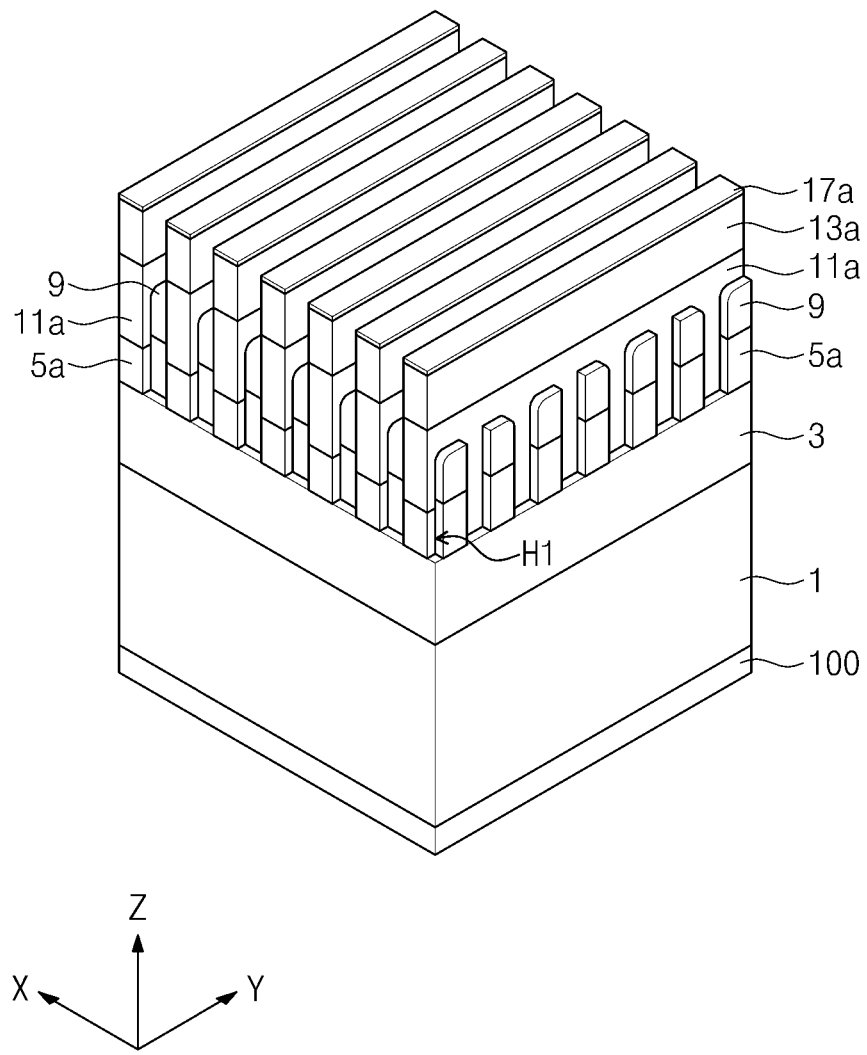

Referring to FIG. 8, the second mask layer 5 may be etched using the second spacer line patterns 17 and the first spacer line patterns 9 as etch masks, thereby forming a second mask pattern 5a with a plurality of first holes H1. In example embodiments, the second mask pattern 5a may be formed to have a mesh, net, or lattice structure. The second spacer line patterns 17 may be etched during the etching of the second mask layer 5 to form a remainder 17a remaining on the third mask line patterns 13a. In some examples, all of the second spacer line patterns 17 may be removed during this etching to expose third mask line pattern 13a. It may also be possible to select material for second line patterns 17 such that little is removed during this etching. The first holes H1 may be formed in second mask layer 5 (forming second mask pattern 5a) to expose a top surface of the first mask layer 3. The etching may be anisotropic.

Figure 9:
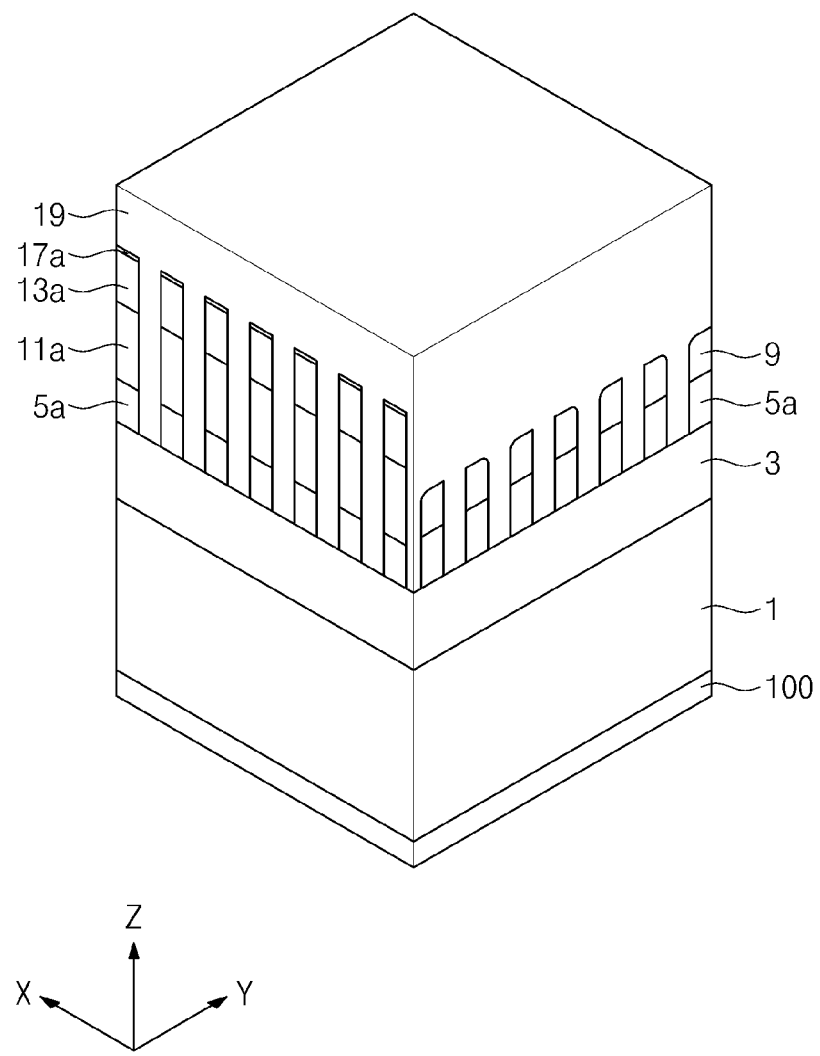

Referring to FIG. 9, a second planarization layer 19 may be formed on the remainder of second line patterns 17a over semiconductor substrate 100. The second planarization layer 19 may be formed of a spin-on-carbon (SOC) layer. The second planarization layer 19 may be supplied in the form of liquid and be formed using a spin-coating process. Accordingly, the second planarization layer 19 may have a good gap-fill property. For example, the second planarization layer 19 may be formed to fill the first holes H1 in second mask pattern 5a, spaces between the first spacer line patterns 9, spaces between the first planarization line patterns 11a, and spaces between the third mask line patterns 13a, and to have substantially a flat top surface. The second planarization layer 19 may be formed to cover top surfaces of remainder patterns 17a (as shown in FIG. 9). Alternatively, the second planarization layer 19 may be formed to a height greater than a height of top surfaces of first spacer line patterns 9 but less than a height of top surfaces of remainder patterns 17a. A dry process may be performed on the second planarization layer 19.

Figure 10:
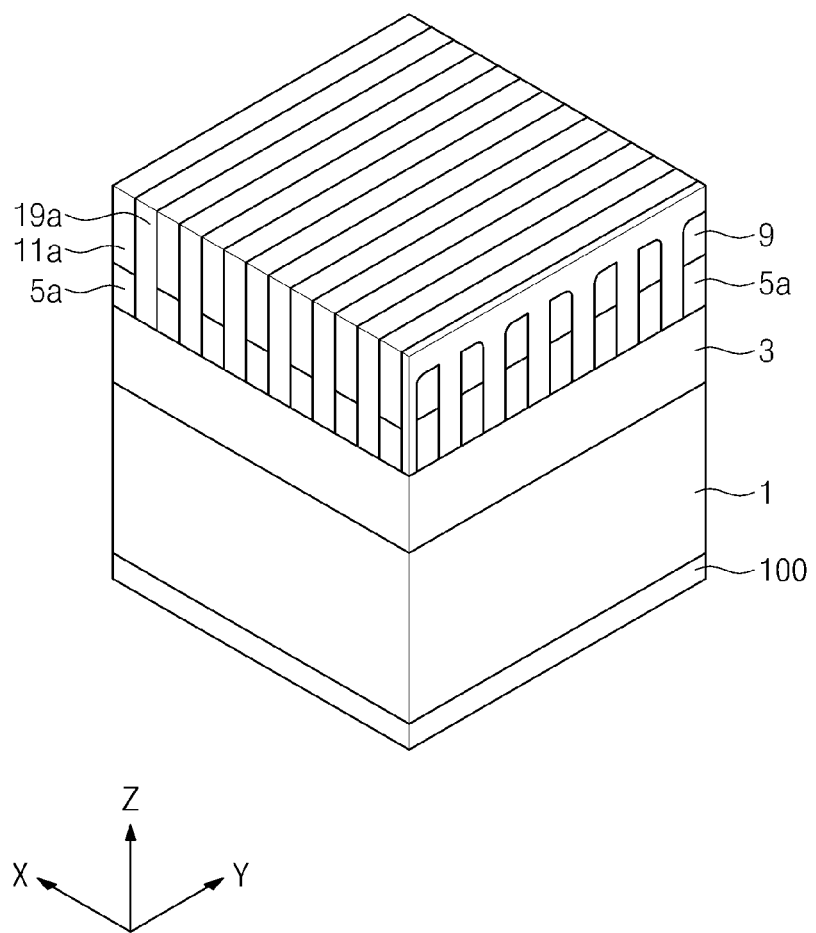

Referring to FIG. 10, a planarization etching process may be performed to remove upper portions of the second planarization layer 19, remainder patterns 17a and the third mask line patterns 13a on the first planarization line patterns 11a. Portions of second planarization layer 19 may remain between the first planarization line patterns 11a forming second planarization line patterns 19a. The planarization etching process may be performed using an etch-back process. The etch back process may be selected to have little or no etch selectivity with respect to the second planarization layer 19 made of the SOC layer and the third mask line patterns 13a made of the silicon oxynitride layer. The etch back process may comprise a chemical-mechanical polishing (CMP). The etch back process may result in a substantially planar surface after completion, although slight deviations may occur, such as from dishing if CMP is used as the etch back process. The etch back process may etch to remove remainder patterns 17a and third mask line patterns 13a and stop upon determining exposure of the first planarization line patterns 11a (which is represented by FIG. 10). Alternatively, the etch back process may continue and remove a substantial amount or all of first planarization line patterns 11a. For example, the etch back process may stop upon determining exposure of second mask pattern 5a.

Figure 11:
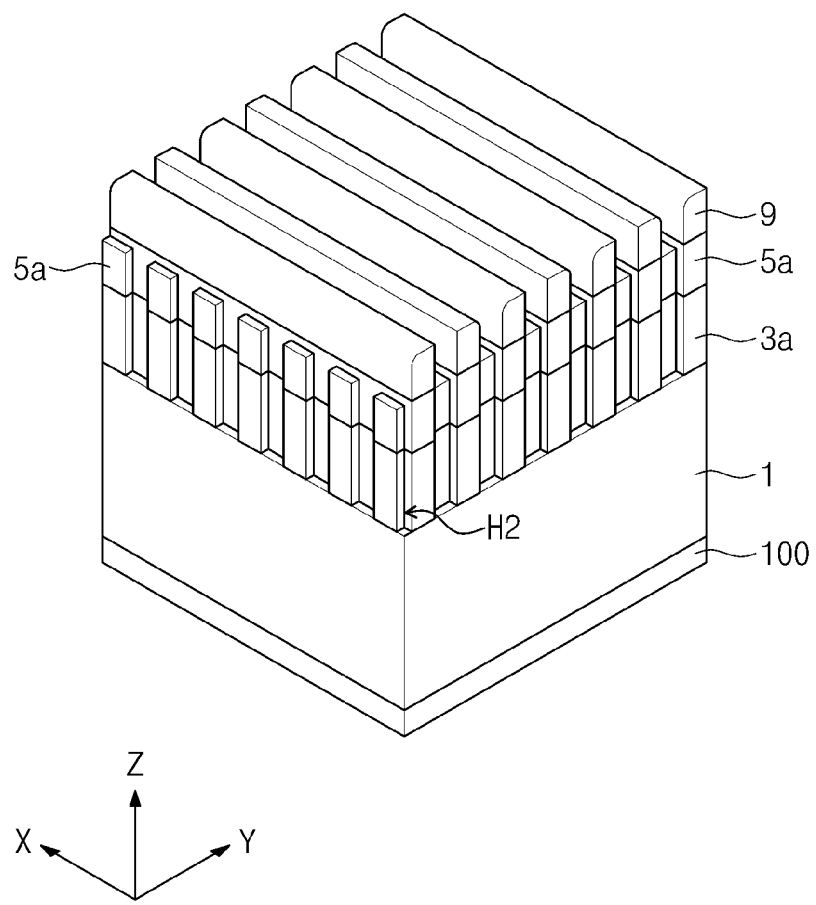

Referring to FIG. 11, the first and second planarization line patterns 11a and 19a may be removed to expose the first spacer line pattern 9 and the second mask pattern 5a. The first mask layer 3 may be etched using the first spacer line pattern 9 and the second mask pattern 5a as an etch mask to form a first mask pattern 3a with second holes H2. Accordingly, each of the second holes H2 may be patterned from the corresponding one of the first holes H1 at a corresponding location and with a corresponding size (e.g., the same size), and the first mask pattern 3a may be formed to have a mesh, net, or lattice structure. The second holes H2 may be formed to expose a top surface of the target layer 1.

Figure 12:
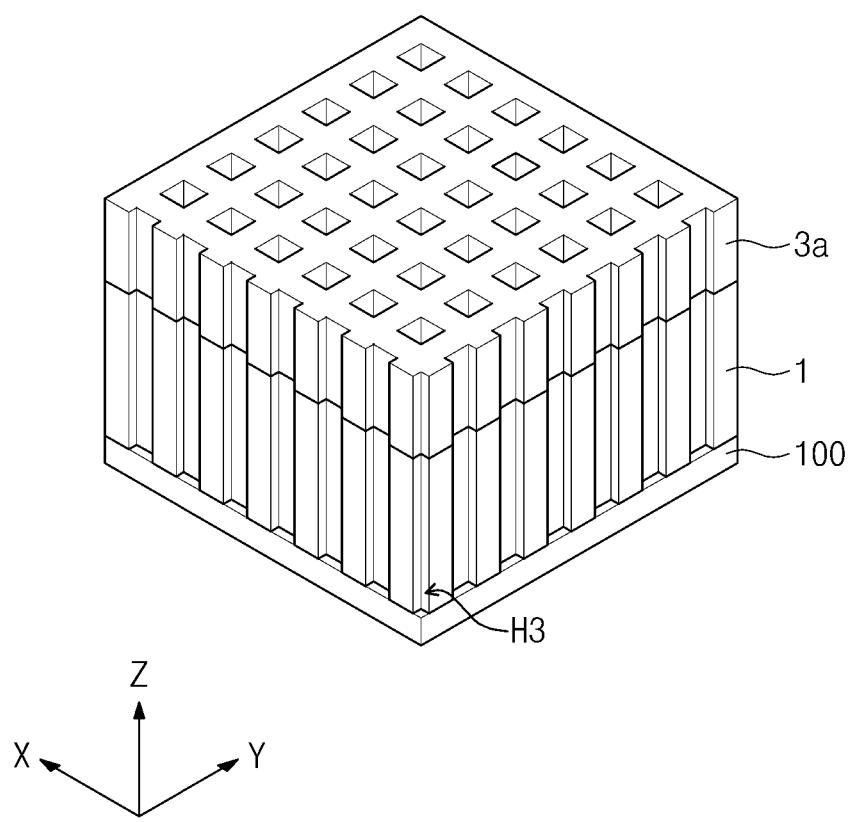

Referring to FIG. 12, the target layer 1 may be etched using the first mask pattern 3a as an etch mask to form third holes H3 corresponding to the second holes H2. The etching of the target layer 1 may be performed in such a way that the second mask pattern 5a and the first spacer line pattern 9 can be removed with the same etching step (e.g., with the same etchant). The removal of the second mask pattern 5a and the first spacer line pattern can be etched at the substantially same etch rate as that of the target layer 1. Accordingly, both the second mask pattern 5a and the first spacer line pattern 9 may be removed after the formation of the third holes H3. For example, the first mask pattern 3a may be the sole pattern remaining on the target layer 1. The third holes H3 may expose the top surface of the semiconductor substrate 100 or a top surface of an etch-stop layer, which may be formed on the semiconductor substrate 100.

Thereafter, the first mask pattern 3a may be removed. In the case where the first mask pattern 3a is formed of the amorphous carbon layer, an ashing process may be performed to remove the first mask pattern 3a. Here, there is little risk of film lifting or equipment pollution, which may be caused by a remaining layer. Because the second mask pattern 5a, the first spacer line pattern 9, the third mask line pattern 13a, and the second spacer line pattern 17 have been removed on the first mask pattern 3a, ashing is sufficient for removal of the first mask pattern. Pollutants may be isolated in previous etching steps. Risk of film lifting of target layer 1 when these upper patterns are removed is reduced by the interposition of first mask pattern 3a between target layer 1 and these upper patterns.

According to example embodiments, a method of fabricating a semiconductor may include an etching process, in which spacer line patterns covering sidewalls of photoresist patterns are used. By adjusting a thickness of the spacer line patterns (e.g., by the number of cycles in an ALD process used to form the spacer line patterns), it is possible to reduce widths of holes (e.g., beyond the limitation that can be achieved by a photolithography process).

In addition, the process can be simplified by using an amorphous carbon layer having a high etch selectivity with respect to a target layer as a mask layer. The simplified process enables to reduce risk of process failure, such as a bridge between contact holes.

The method can be used to fabricate various semiconductor devices. For example, in variable resistance memory device (e.g., phase-change random access memory (PRAM)), selection devices (e.g., diode) interposed between bit lines and word lines may be fabricated by the example methods described herein. The selection devices (or diodes) may be provided in the contact holes formed by the methods described herein (e.g., such as through epitaxial growing in the contact holes semiconductor doped of a first type followed by growing in the contact holes semiconductor doped of the second type (e.g., n-type epitaxial silicon followed by p-type epitaxial silicon, or vice versa).

In example embodiments, after forming the second planarization layer 19, a planarization etching process may be performed to remove the third mask layer 13a and the second spacer line patterns (e.g., the second spacer line pattern remainder 17a). Accordingly, a subsequent process does not suffer from technical difficulties (e.g., film lifting or equipment pollution) associated with the remainder of the third mask layer and the second spacer line patterns.

Each of the etching steps described above may be performed as a single etch step or as multiple etch steps. "Single etch step" as used in this application means an etching that uses the same etchant chemical(s) and/or performed in the same process chamber without interruption (although the chemical etchants may change and/or change in percentages during the etching).

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   sequentially forming a first mask layer and a second mask layer on a target layer;
   forming first lines on the second mask layer;
   forming a first planarization layer on the second mask layer to cover the first lines, the first planarization layer having a flat top surface;
   forming a third mask layer on the first planarization layer;
   forming second lines on the third mask layer, the second lines crossing over the first lines;
   etching the third mask layer and the first planarization layer, using the second lines as an etch mask, to form third mask line patterns from the third mask layer and first planarization lines from the first planarization layer, and to partially expose the first lines and the second mask layer;
   etching the second mask layer using the first and second lines as an etch mask to form a second mask pattern from the second mask layer having a mesh pattern;
   forming a second planarization layer to cover the second mask pattern, the second planarization layer having a flat top surface;
   performing a planarization etching process on the second planarization layer to an extent at least to remove the third mask line patterns and form second planarization lines from the second planarization layer between the first planarization lines;
   removing the first and second planarization lines to expose sidewalls of the first lines and the second mask pattern;
   etching the first mask layer using the second mask pattern as an etch mask to form a first mask pattern, the first mask pattern having a mesh pattern; and
   etching the target layer using the first mask pattern as an etch mask to form contact holes.

2. The method of claim 1, wherein the first mask layer is formed of an amorphous carbon layer,
   the first and second planarization layers are formed of a spin-on-carbon (SOC) layer, and
   the second and third mask layers are formed of a silicon oxynitride layer.

3. The method of claim 1, wherein the forming of the first lines comprises:
   forming a plurality of first photoresist patterns on the second mask layer;
   forming the first lines on sidewalls of the first photoresist patterns; and
   removing the first photoresist patterns.

4. The method of claim 3, wherein widths of the first photoresist patterns are the same width as widths of the first lines.

5. The method of claim 4, wherein a space between adjacent ones of the first photoresist patterns is equivalent to three times a width of at least one of the first photoresist patterns.

6. The method of claim 1, wherein the forming of the second line comprises:
   forming a plurality of second photoresist patterns on the third mask layer that cross over the first lines;
   forming the second lines on sidewalls of the second photoresist patterns; and
   removing the second photoresist patterns.

7. The method of claim 6, wherein widths of the second photoresist patterns are the same as widths of the second lines.

8. The method of claim 7, wherein a space between adjacent ones of the second photoresist patterns is equivalent to three times a width of at least one of the second photoresist patterns.

9. The method of claim 1, wherein the first and second lines comprise silicon oxide.

10. The method of claim 9, wherein the target layer comprises a silicon oxide layer, and
    the etching of the target layer comprises removing both of the first lines and the second mask layer and exposing the first mask pattern.

11. A method of fabricating a semiconductor device, comprising:
    forming a mask layer on a target layer;
    forming a plurality of first line patterns on the mask layer;
    forming a first planarization layer on the first line patterns;
    forming a plurality of second line patterns on the first planarization layer that cross over the first line patterns;
    etching the first planarization layer using the second line patterns as an etch mask to expose the first line patterns;
    etching the mask layer using the second and first line patterns to form a mask pattern from the mask layer having a mesh pattern;
    forming a second planarization layer on the mask pattern;
    removing a portion of the second planarization layer and the second line patterns by a planarization etching process; and
    etching the target layer using the mask pattern to form contact holes.

12. The method of claim 11,
    wherein the mask layer comprises a first mask layer and a second mask layer, the first mask layer comprising an amorphous carbon layer, and the second mask layer comprising a silicon oxynitride layer,
    wherein the first and second planarization layers each comprise a respective
    spin-on-carbon layer.

13. The method of claim 12, wherein the mask pattern comprises a second mask pattern formed from the second mask layer and a first mask pattern formed from the first mask layer, and the method further comprises:

forming the second mask pattern before the forming of the second planarization layer, and forming the first mask pattern after the forming of the second planarization layer.

14. The method of claim 12, further comprising, forming a third mask layer on the first planarization layer, before the forming of the second line patterns, wherein the third mask layer is removed by the planarization etching process.

15. A method of forming a plurality of holes in a target layer, comprising:

forming a first mask layer on the target layer;

forming a second mask layer on the first mask layer, the second mask layer having an etch selectivity with respect to the first mask layer;

forming a first set of line patterns extending in a first direction over the second mask layer;

forming a second set of line patterns extending in a second direction, different from the first direction, over the second mask layer;

using the first set of line patterns and second set of line patterns as a mask, forming a first resultant structure including at least etching the second mask layer to form a second mask layer pattern having a plurality of holes;

forming a planarization layer over the first resultant structure after etching the second mask layer;

forming a second resultant structure including at least performing a planarization etch of the planarization layer and portions of the first resultant structure, the second resultant structure having a flat top surface;

etching the second resultant structure including etching the first mask layer to form a first mask layer pattern having a plurality of holes corresponding to the holes of the second mask layer pattern;

etching the plurality of holes in the target layer using the first mask layer pattern as a mask.

16. The method of claim 15, wherein the second set of line patterns each comprise a stack of first, second and third materials, and wherein the step of performing a planarization etch of the planarization layer and portions of the first resultant structure comprises removing the first and second materials of each of the second set of line patterns to expose the third material of the second set of line patterns.

17. The method of claim 16, wherein the first material is silicon oxide, the second material is silicon oxynitride and the third material is spin on carbon.

18. The method of claim 15, further comprising:

ashing to remove the first mask layer pattern.

19. The method of claim 15, wherein each of the first set of line patterns and second set of line patterns comprise respective spacer line patterns each formed by forming the respective spacer line pattern on a sidewall of a respective photoresist pattern and removing the respective photoresist pattern.

20. The method of claim 15, wherein the step of forming the planarization layer over the first resultant structure after etching the second mask layer includes filling the holes of the second mask layer pattern with material of the planarization layer.

* * * * *